United States Patent [19]

Kujas

[11] Patent Number: 4,686,322
[45] Date of Patent: Aug. 11, 1987

[54] SOLAR PANEL

[75] Inventor: Erich F. Kujas, Philadelphia, Pa.

[73] Assignee: RCA Corporation, Princeton, N.J.

[21] Appl. No.: 764,572

[22] Filed: Aug. 12, 1985

[51] Int. Cl.$^4$ .......................................... H01L 25/02
[52] U.S. Cl. ..................................... 136/245; 136/292
[58] Field of Search ........................ 136/244, 245, 292; 244/173

[56] References Cited

U.S. PATENT DOCUMENTS

| | | | |
|---|---|---|---|
| 3,459,391 | 8/1969 | Haynos | 244/1 |
| 3,565,719 | 2/1971 | Webb | 156/212 |
| 3,658,596 | 4/1972 | Osborne | 136/251 |
| 4,101,101 | 7/1978 | Barkats et al. | 244/173 |
| 4,394,529 | 7/1983 | Gounder | 136/245 |
| 4,401,710 | 8/1983 | Bansemir et al. | 428/229 |
| 4,554,038 | 11/1985 | Allard | 156/196 |

FOREIGN PATENT DOCUMENTS 3317269  12/1984  Fed. Rep. of Germany ...... 136/245

OTHER PUBLICATIONS

H. S. Rauschenbach, "Solar Cell Array Design Handbook", Van Nostrand Reinhold Co., New York (1980), Chapters 7 and 10.

Kirk-Othmer: Encyclopedia of Chemical Technology, vol. 16, 3rd Ed., pp. 125-137, "Novoloid Fibers" Copyright 1981, J. Wiley & Sons.

Primary Examiner—Aaron Weisstuch
Attorney, Agent, or Firm—Clement A. Berard, Jr.; Robert L. Troike

[57] ABSTRACT

A novel solar panel is disclosed which has a supporting substrate which is comprised of one or more plies of resin reinforced novoloid fabric.

7 Claims, 3 Drawing Figures

SOLAR PANEL

This invention relates to a novel solar panel which is especially useful in space.

BACKGROUND OF THE INVENTION

Solar panels are conventionally used as a source of electrical power for spacecraft, such as satellites. The solar panels typically used for spacecraft include a substrate and a plurality of individual photovoltaic solar cells which are secured to a face surface of the substrate. The individual solar cells are electrically connected together to form a series-parallel solar cell array which, when oriented properly toward the sun, converts solar energy into electrical energy.

The most important consideration for solar panels used on spacecraft is reliability. If a solar panel fails in space, it is difficult, if not impossible, to correct or compensate for the resulting loss of electrical power with the result that the useful life of the entire spacecraft is often prematurely ended.

Reliability of solar panels in space applications is difficult to obtain because the solar panels are subjected to a wide variety of conditions in use, many of which are extremely harsh and tend to damage or destroy the solar panels. For example, during the launch of a spacecraft such as a satellite into outer space, the solar panels, which are typically stored for launch in a compact, folded configuration, are subjected to the extreme vibrations and high gravitational forces encountered during blast off. After the satellite has been separated from the launch vehicle and placed into orbit, the solar panels are deployed from their compact, folded configuration and extended to an open configuration with the array of solar cells oriented toward the sun. In the deployed configuration, the solar panels are subjected to substantial thermal stresses; the solar cells and the face surfaces of the substrates are subjected to the intense heat of the sun while the back surfaces of the substrates are subjected to the extreme cold of outer space. Furthermore, in order to have the solar array operate at maximum efficiency it is necessary that the substrate be relatively rigid so that it can maintain all the solar cells in the correct alignment with respect to the sun and be sufficiently strong so as not to break under the forces inherently applied to the deployed solar panels in space. Because of the above-noted requirements it has been extremely difficult to form the solar panels with the required reliability.

The most important consideration after reliability in the construction of solar panels for spacecraft, such as satellites, is weight. The solar panels should be as light in weight as possible to allow increased payloads and increased amounts of fuel to be stored on board the satellite. In this regard, it should be noted that the relative amount of fuel stored on a satellite is particularly important as this fuel is used for the rocket thrusters which are periodically activated to reorient the satellite to the proper attitude. Any additional fuel that can be stored on board by using lighter weight solar panels can be used to extend the useful life of the satellite.

It has not heretofore been possible to construct a solar panel having the desired combination of high reliability and light weight. Suggestions made heretofore to improve the reliability of the solar panels typically increased the weight of the solar panels, and suggestions made to reduce the weight of the solar panels caused a reduction in the overall properties and particularly the flexural strength of the solar panels and thus reduced reliability. For example, it was suggested to use thicker, stiffer substrates and/or to add reinforcement ribs to stiffen the substrate of the solar panels. These proposals and other similar proposals significantly increased the weight of the solar panels. It was also suggested to use thin plastic films as the supporting substrate to lighten the solar panels, but this caused the substrate to be excessively flexible and unstable which decreased its reliability.

State of the art substrates are comprised of a honeycomb core having an outer skin. These substrates are made with various combinations of materials, including aluminum honeycomb cores with aluminum skins, fiber reinforced plastic honeycomb cores with fiber reinforced plastic skins, and aluminum honeycomb cores with fiber reinforced plastic skins. These substrates require, in addition to the honeycomb core and associated skin, reinforcement ribs to provide adequate strength. These ribs, however, increased the total weight. Furthermore, the relatively complex honeycomb substrates are expensive to manufacture and prone to mechanical failure, especially at the junctions of the skin with the honeycomb core.

What would be highly desirable would be a solar panel having a substrate which is relatively strong, simple in construction, has a high degree of reliability, and which is relatively light weight as compared to the solar panel heretofore employed.

SUMMARY OF THE INVENTION

A novel solar panel is disclosed which is especially useful for spacecraft applications. The solar panel has a supporting substrate which is comprised of one or more plies of a resin reinforced novoloid fabric. The novel solar panel is lighter in weight and has at least equivalent overall physical properties as compared to conventional solar panels.

DETAILED DESCRIPTION OF THE INVENTION

Figure 1:
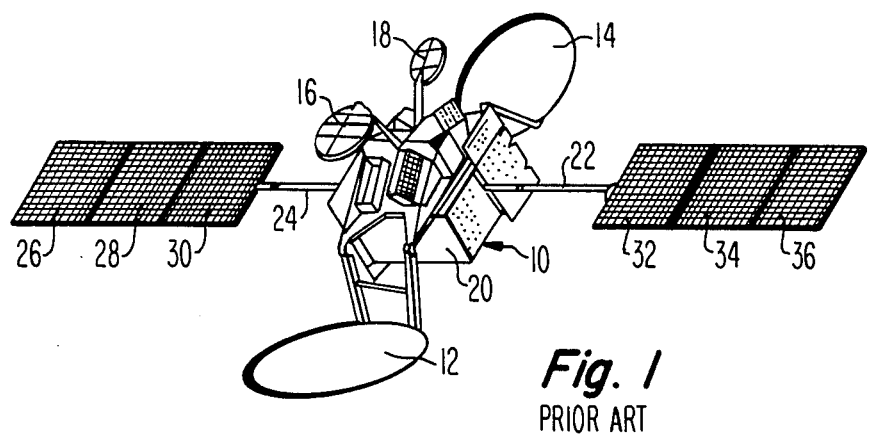
FIG. 1 is a pictorial illustration of a satellite showing the solar panels thereof in the fully extended position.

In FIG. 1 there is illustrated a communications satellite 10 which includes main reflectors 12, 14, and subreflectors 16, 18 attached to the body 20 of the satellite 10. The body 20 of the satellite 10 also contains the fuel supply and the rocket thrusters (not shown) which are used to reorient the satellite 10. Extending outward from each side of the body 20 of the satellite 10 are booms 22, 24 on which are mounted a number of individual solar panel units 26, 28, 30, 32, 34, 36. The solar panel units in use are oriented towards the sun and convert solar energy into electrical energy.

Figure 2:
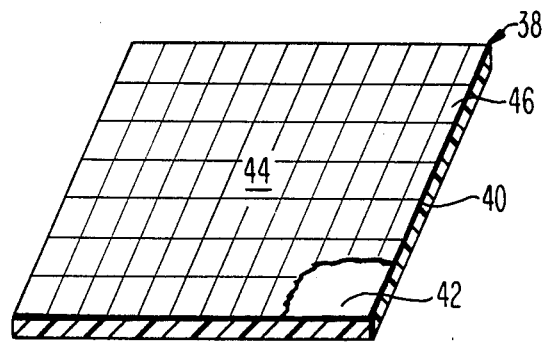
FIG. 2 is an isometric projection in partial cross section of a portion of a solar panel of this invention.
Figure 3:
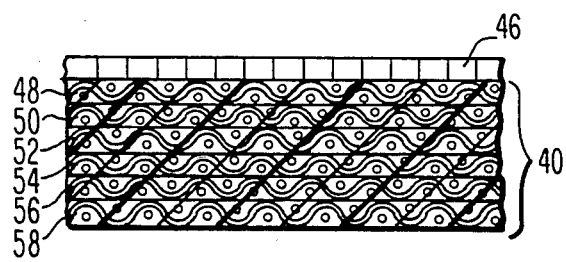
FIG. 3 is a cross-sectional illustration of the preferred embodiment of the solar panel of the present invention.

The structure of the novel solar panel 38 of this invention is best illustrated in FIGS. 2 and 3. The solar panel 38 is comprised of a substrate 40 having a face surface 42 on which an array of solar cells 44 are attached. In addition to the substrate 40 and the array of solar cells 44, the solar panel 38 can also include other conventional elements which are not illustrated, such as protective covers for the solar cell array 44, electrical networks for interconnecting the individual solar cells, brackets and support structures for securing the solar panels to the booms 22, 24 and the like.

The substrate 40 of the solar panel 38 of this invention is comprised of at least one ply of a resin reinforced novoloid fabric. The novoloid fabrics are manufactured from novoloid fibers. Novoloid fibers chemically are cross-linked phenolic-aldehyde fibers which are prepared by acid catalyzed cross linking of a melt spun novolac resin with formaldehyde. The generic term novoloid is recognized by the Federal Trade Commission as designating a manufactured fiber containing at least 85% by weight of a cross-linked novolac. Novoloid fibers are commercially available under the trademark Kynol from Nippon Kynol, Inc. (Japan) and American Kynol, Inc. They are available in a range of diameters from about 14 to 33 μm. For purposes of this invention, it has been found that the smaller diameter novoloid fibers are preferable because stronger bonding is possible with the resin used to form the matrix of the substrate 40.

Novoloid fibers have a unique combination of physical properties which make the novoloid fibers especially useful for solar panels which will be used in outer space. The novoloid fibers are stable when exposed both to relatively high temperatures for prolonged periods of time especially in the absence of oxygen as in outer space, and at very low temperatures. They are also stable to ultraviolet radiation.

In the manufacture of the solar panel 38 of this invention, the novoloid fibers are initially formed into either woven or knitted fabrics using conventional textile manufacturing methods. The use of fabric as opposed to fiber facilitates the manufacture of the substrate 40 and also substantially increases the overall strength of the substrate 40. The fabric can be manufactured in various weaves and different knits. It is preferable, however, to form the fabric with a relatively lightweight, open structures, so as to insure proper wetting of the novoloid fibers with the resin employed in the preparation of the substrate 40. It has been found that the optimum results are obtained with either plain weaves or twills having a weight of about 9 to about 10 ounces per square yard (278–286 grams/sq. meter).

Various resins can be used in the manufacture of the substrate 40, providing they have good strength and good stability to environmental conditions encountered in space. Epoxy-based resins are known to be suitable for this application and can be used in the present invention. Certain polyester resins, and in particular the isophthalic polyester resins, are particularly suitable for the manufacture of substrates 40 of this invention. Suitable polyester resins are commercially available from various sources, such as MR 14042 sold by U.S.S. Chemicals.

The substrate 40 is manufactured using conventional molding techniques. The number of plies of novoloid fabric required to form a specified substrate are initially cut to size. The number of plies can be as few as one relatively heavy ply, but preferably a number of lighter weight plies 48, 50, 52, 54, 56, 58 as shown in FIG. 3 are employed rather than one heavier ply. In practice, it has been found that it is preferable to use about six plies of fabric since this does not unduly complicate the manufacturing process and results in the final substrate 40 having an excellent combination of physical properties.

The plies of the novoloid fabric are impregnated with the resin making sure that the individual novoloid fibers are well wet during the process. The relative amount of the novoloid fabric and the resin employed in the manufacture of the substrate 40 can be varied somewhat, but the substrate 40 should contain about 40 to 60% by weight of the novoloid fabric, with the remainder being the resin. The impregnated plies of the novoloid fabric are then laid up on each other and the assembly is compression molded to form a laminate which, after trimming, is used as the substrate 40 of the solar panel 38 of this invention. The resin employed in the manufacture of the substrate 40 should form an interlocking matrix between and through the plies 48, 50, 52, 54, 56, 58 of the novoloid fabric of the substrate 40.

Once the substrate 40 is obtained, the solar cell array 44 and any other required elements are attached to the substrate 40 in conventional manner.

The substrate 40 which is obtained in accordance with this invention is at least about 10 to 11% lighter in weight than the equivalent strength substrate made from conventional materials such as fiberglass or aramid fibers. This substantial reduction in weight allows the satellite 10 to carry additional fuel which as noted above can substantially extend the life of the satellite 10 by permitting additional reorientation of the satellite 10 as required in use.

In order to obtain a more direct comparison of the advantages of the substrate 40 of the present invention as compared to the prior art substrate, a series of substrates were prepared using various types of fabrics and resin systems. The amounts and weights of fabrics used were selected so as to be most suitable for the particular system evaluated. The below-tabulated results were obtained.

TABLE

| FABRIC REINFORCEMENT RESIN MATRIX | ARAMID EPOXY | FIBERGLASS EPOXY | NOVOLOID POLYESTER |
|---|---|---|---|
| Fabric Content, Weight % | 55 | 47 | 40 |
| Resin Formula, Weight % | 45 | 53 | 60 |
| Specific Gravity | 1.32 | 1.86 | 1.23 |
| Tensile Strength, psi | 28,500 | 14,400 | 32,800 |
| Tensile Modulus, $10^6$ psi | 2.96 | 2.23 | 2.98 |
| Flexural Strength, psi | 35,500 | 29,100 | 39,500 |
| Flexural Modulus, $10^6$ psi | 2.67 | 2.33 | 2.97 |
| IZOD Impact Strength, ft/lb in. | 17.4 | 19 | 18.4 |

What is claimed is:

1. In a solar panel having a substrate with a face surface and an array of solar cells attached to the face surface the improvement wherein the substrate is comprised of at least one ply of a resin reinforced novoloid fabric.

2. The solar panel according to claim 1 wherein the novoloid fabric comprises between about 40 to 60% by weight of the substrate with the remainder being comprised of said resin.

3. The solar panel according to claim 1 wherein the substrate is comprised of a plurality of overlying plies of said novoloid fabric with the resin forming an interlocking matrix between and through said plies.

4. The solar panel according to claim 1 wherein the novoloid fabric has a weight of about 9 to about 10 ounces per square yard (278–286 grams/sq. meter).

5. The solar panel according to claim 1 which includes at least six plies of novoloid fabric.

6. The solar panel according to claim 1 wherein the resin is a polyester resin.

7. The solar panel according to claim 1 wherein the resin is an isophthalic polyester resin.

* * * * *